(12) United States Patent
Lo et al.

(10) Patent No.: US 11,990,876 B2
(45) Date of Patent: May 21, 2024

(54) MULTI-MODE MULTI-PORT DRIVER FOR TRANSCEIVER INTERFACE

(71) Applicant: QUALCOMM INCORPORATED, San Diego, CA (US)

(72) Inventors: Yung-Chung Lo, San Diego, CA (US); Hyejeong Song, San Diego, CA (US); Bhushan Shanti Asuri, San Diego, CA (US); Sahar Nozari, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 38 days.

(21) Appl. No.: 17/478,431

(22) Filed: Sep. 17, 2021

(65) Prior Publication Data
US 2023/0049925 A1 Feb. 16, 2023

Related U.S. Application Data

(60) Provisional application No. 63/233,585, filed on Aug. 16, 2021.

(51) Int. Cl.
| | |
|---|---|
| *H04B 1/40* | (2015.01) |
| *H03F 1/02* | (2006.01) |
| *H03F 3/193* | (2006.01) |
| *H03F 3/21* | (2006.01) |
| *H03F 3/24* | (2006.01) |

(52) U.S. Cl.
CPC ........... *H03F 3/245* (2013.01); *H03F 1/0211* (2013.01); *H04B 1/40* (2013.01); *H03F 2200/294* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 7,092,691 B2 | 8/2006 | Bohn et al. | |
| 7,936,708 B2 | 5/2011 | Kesavan et al. | |
| 7,952,433 B2* | 5/2011 | An | H03F 3/211 330/51 |
| 8,036,293 B1 | 10/2011 | Kim et al. | |
| 8,068,795 B2 | 11/2011 | Bavisi et al. | |
| 8,219,141 B2 | 7/2012 | Yang et al. | |
| 8,280,325 B2* | 10/2012 | Zolfaghari | H04B 1/0067 330/171 |
| 8,750,810 B2* | 6/2014 | Pletcher | H03F 1/56 330/144 |
| 10,491,176 B1 | 11/2019 | Hur et al. | |
| 11,171,683 B2* | 11/2021 | Elsayed | H03K 17/081 |

(Continued)

OTHER PUBLICATIONS

International Search Report and Written Opinion—PCT/US2022/038124—ISA/EPO—dated Nov. 25, 2022.

*Primary Examiner* — Pablo N Tran
(74) *Attorney, Agent, or Firm* — Smith Tempel Blaha LLC/Qualcomm Incorporated

(57) ABSTRACT

A transceiver interface circuit, comprising a driver amplifier (DA), a load line impedance modulation circuit coupled to the DA; and multiple selectable output ports coupled to the load line impedance modulation circuit, an impedance presented by the load line impedance modulation circuit being adjustable dependent on at least a number of output ports coupled to the load line impedance modulation circuit.

28 Claims, 12 Drawing Sheets

(56) References Cited

U.S. PATENT DOCUMENTS

| | | | |
|---|---|---|---|
| 2008/0139131 A1* | 6/2008 | Macphail | H03F 1/02 |
| | | | 455/90.2 |
| 2010/0248660 A1* | 9/2010 | Bavisi | H04B 1/0458 |
| | | | 455/120 |
| 2011/0221522 A1* | 9/2011 | An | H03F 3/45179 |
| | | | 330/126 |
| 2013/0099866 A1* | 4/2013 | Conradi | H03F 1/0288 |
| | | | 330/126 |
| 2014/0327483 A1* | 11/2014 | Balteanu | H03F 3/68 |
| | | | 330/295 |
| 2015/0050901 A1* | 2/2015 | Lee | H04B 1/0483 |
| | | | 455/127.3 |
| 2015/0270813 A1 | 9/2015 | Morshedi et al. | |
| 2017/0201218 A1 | 7/2017 | Wang et al. | |
| 2018/0175801 A1* | 6/2018 | Blednov | H03F 3/213 |
| 2018/0226924 A1* | 8/2018 | Ngai | H03F 1/0205 |
| 2020/0099342 A1 | 3/2020 | Hau et al. | |
| 2020/0212862 A1 | 7/2020 | Hulsteijn et al. | |
| 2020/0367257 A1 | 11/2020 | Hormis et al. | |
| 2021/0099140 A1 | 4/2021 | Hassan et al. | |

\* cited by examiner

900 →

| HB CPE (12.1GHz) | | | |
|---|---|---|---|
| Port | Pout (dBm) | LOL (dBc) | RSB (dBc) |
| V1 | -15.3 | -32.9 | -56.5 |
| V2 | -15.9 | -34.8 | -59.6 |
| V3 | -15.7 | -32.2 | -56.8 |
| V4 | -16 | -33.7 | -57.5 |
| H1 | -15.1 | -29.8 | -53.2 |
| H2 | -15.7 | -30 | -52.7 |
| H3 | -15.1 | -30 | -54.1 |
| H4 | -15.1 | -30.2 | -53.8 |

MULTI-MODE MULTI-PORT DRIVER FOR TRANSCEIVER INTERFACE

RELATED APPLICATIONS

This application claims priority to and the benefit of U.S. Provisional Patent Application No. 63/233,585, entitled "MULTI-MODE MULTI-PORT DRIVER FOR MMWAVE TRANSCEIVER INTERFACE," filed Aug. 16, 2021, the contents of which are hereby incorporated herein by reference in its entirety as if fully set forth below and for all applicable purposes.

FIELD

The present disclosure relates generally to electronics, and more specifically to radio frequency (RF) transmitters and receivers.

BACKGROUND

Wireless communication devices and technologies are becoming ever more prevalent as are communication systems that operate at millimeter-wave (mmW) frequencies. Designing systems and/or chips that work for communications at high frequencies, such as mmW frequencies or frequencies approximately half of a mmW frequency, is challenging and requires innovative solutions. For example, it may be difficult to design systems and/or chips with a form factor appropriate size, with reduced discrepancy between components or paths, and/or with appropriate loading while operating in different configurations.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a transceiver interface circuit, comprising a driver amplifier (DA), a load line impedance modulation circuit coupled to the DA; and multiple selectable output ports coupled to the load line impedance modulation circuit, an impedance presented by the load line impedance modulation circuit being adjustable dependent on at least a number of output ports coupled to the load line impedance modulation circuit.

Another aspect of the disclosure provides a method for communication including selectively configuring a communication device in a first mode, and selectively adjusting a load line impedance of the communication device based on the selected mode.

Another aspect of the disclosure provides a device including means for selectively configuring a communication device in a first mode, and means for selectively adjusting a load line impedance of the communication device based on the selected mode.

Another aspect of the disclosure provides a load line impedance modulation circuit including a magnetic circuit, an adjustable capacitance coupled to an output of the magnetic circuit, a plurality of adjustable resistances coupled to an output of the magnetic circuit, and a plurality of selectable output ports coupled to the plurality of adjustable resistances, an impedance presented by the load line impedance modulation circuit being adjustable dependent on at least a number of output ports coupled to the plurality of adjustable resistances.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

FIG. 9 shows a table illustrating RSB variation over four (4) ports in an exemplary high band (HB) CPE communication device in the 12.1 GHz band.

DETAILED DESCRIPTION

Figure 1:
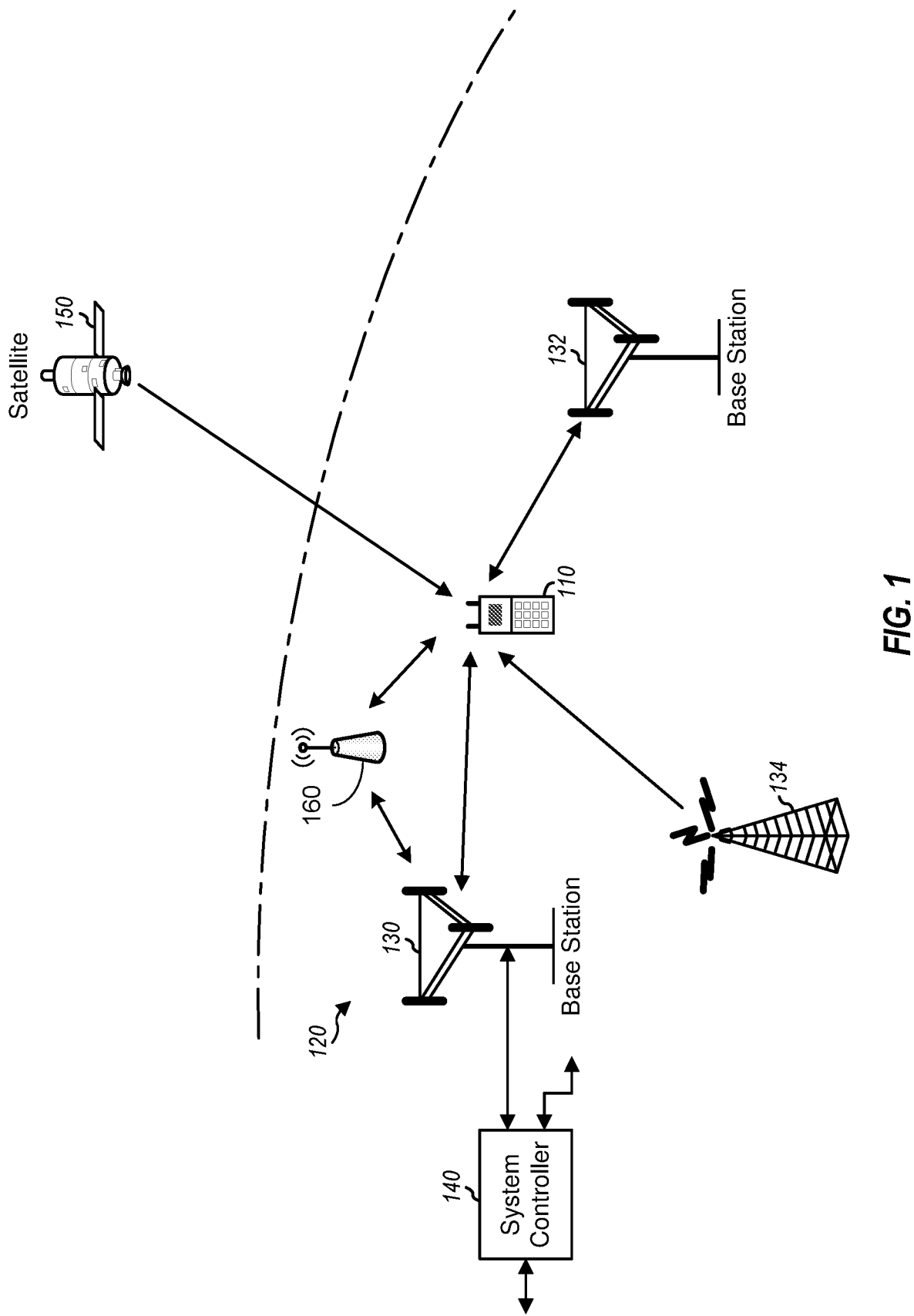
FIG. 1 is a diagram showing a wireless device communicating with a wireless communication system.

The word "exemplary" is used herein to mean "serving as an example, instance, or illustration." Any aspect described herein as "exemplary" is not necessarily to be construed as preferred or advantageous over other aspects.

A mmW intermediate frequency integrated circuit (IFIC) typically supports a single mmW radio frequency integrated circuit (RFIC) in a user equipment (UE) mode but generally supports more than one mmW RFIC in customer premises equipment (CPE) and small cell (cell site modem (CSM) and femtocell (FSM)) modes. In previous solutions, a mmW IFIC may have a total of eight (8) driving amplifiers (DAs) to support eight (8) communication ports. However, a newer generation mmW IFIC may implement 16 DAs for supporting multiple communication bands, such as, for example, a low band (LB) and high band (HB) operating mode. Unfortunately, a DA occupies considerable silicon area, thus making integrating such a large number of DAs on a die challenging. Moreover, multiple DAs lead to DA-dependent behavior. In previous IFICs, the residual sideband (RSB) and LO leakage performance exhibit significant discrepancy among the different communication ports due to the DA mismatch and different spatial electromagnetic (EM)/package coupling over the multiple DAs. Because the RSB and local oscillator (LO) leakage are calibrated based on a single baseband filter, the calibration is not able to account for the RSB discrepancy over multiple communication ports that results from the DA-dependent behavior.

In a communication system that uses a phased array antenna system, a communication device may be reconfigurable to operate in more than one mode. For example, a communication device may be configurable to operate in a user equipment (UE) mode and also in a customer premises equipment (CPE) mode. Operating in different modes often employs different circuitry on the communication device. For example, in a UE mode, intermediate frequency (IF) circuitry may support one type or amount of RF circuitry, and in CPE mode, the IF circuitry may support another type or amount of RF circuitry. Further, there may be multiple UE and/or CPE modes which each support a different number of antennas. One element in IF circuitry that consumes a high amount of power and area on the circuit is referred to as a driver amplifier. A driver amplifier may be part of a transceiver interface whereby the driver amplifier may operate at a first frequency (for example, an intermediate frequency (IF)), and provide an IF signal to another circuit, for example, a radio frequency (RF) circuit. Therefore, it would be desirable to reduce or minimize the number of driver amplifiers on an IF circuit that support multiple configurations of a communication device. As that one DA may support be used to support different circuitry in different modes of communications, it is beneficial to ensure proper operation of the DA in each of the different modes (e.g., by ensuring an appropriate or substantially constant load line impedance is presented to the DA).

In an exemplary embodiment, a transceiver interface as described herein may be used in a millimeter wave (mmW) communication system in an intermediate circuit located between baseband signal processing elements and radio frequency (RF) signal processing elements. For example, the intermediate circuit may be included in an IC or chip which converts between IF signals and baseband signals, and which is separate from an IC or chip which processes analog baseband signals and also separate from an IC or chip which converts between IF and a mmW frequency. In another example, the intermediate circuit and the circuitry which process analog baseband signals are included on the same chip or IC. In yet another example, signals output from the transceiver interface (or received by the transceiver interface) have the same frequency as signals which are wirelessly transmitted from the communication device. In such examples, the transceiver interface may not be coupled to a mmW subsystem, or a certain port of the transceiver interface may be coupled to a mmW subsystem while one or more other ports are coupled to one or more antennas such that signals communicated between the one or more other ports and the one or more antennas are not converted in frequency. For example, the one or more antennas may be configured to operate in an PR3 frequency.

FIG. 1 is a diagram showing a wireless device 110 communicating with a wireless communication system 120.

The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134) and/or signals from satellites (e.g., a satellite 150 in one or more global navigation satellite systems (GNSS), etc). Wireless device 110 may support one or more radio technologies for wireless communication such as LTE, WCDMA, CDMA 1x, EVDO, TD-SCDMA, GSM, 802.11, 5G, etc.

The wireless communication system 120 may also include a wireless device 160. In an exemplary embodiment, the wireless device 160 may be a wireless access point, or another wireless communication device that comprises, or comprises part of a wireless local area network (WLAN). In an exemplary embodiment, the wireless device 160 may be referred to as a customer premises equipment (CPE), which may be in communication with a base station 130 and a wireless device 110, or other devices in the wireless communication system 120. In some embodiments, the CPE may be configured to communicate with the wireless device 110 using WAN signaling and to interface with the base station 130 based on such communication instead of the wireless device 110 directly communicating with the base station 130. In exemplary embodiments where the wireless device 160 is configured to communicate using WLAN signaling, a WLAN signal may include WiFi, or other communication signals. In some embodiments, a single wireless device, such as the wireless device 110 or the wireless device 160, may be configured to operate in multiple modes. For example, a single wireless device may be configured to operate in a first mode as a UE and in a second mode as a CPE.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies. Wireless device 110 may also be capable of communicating directly with other wireless devices without communicating through a network.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2A:
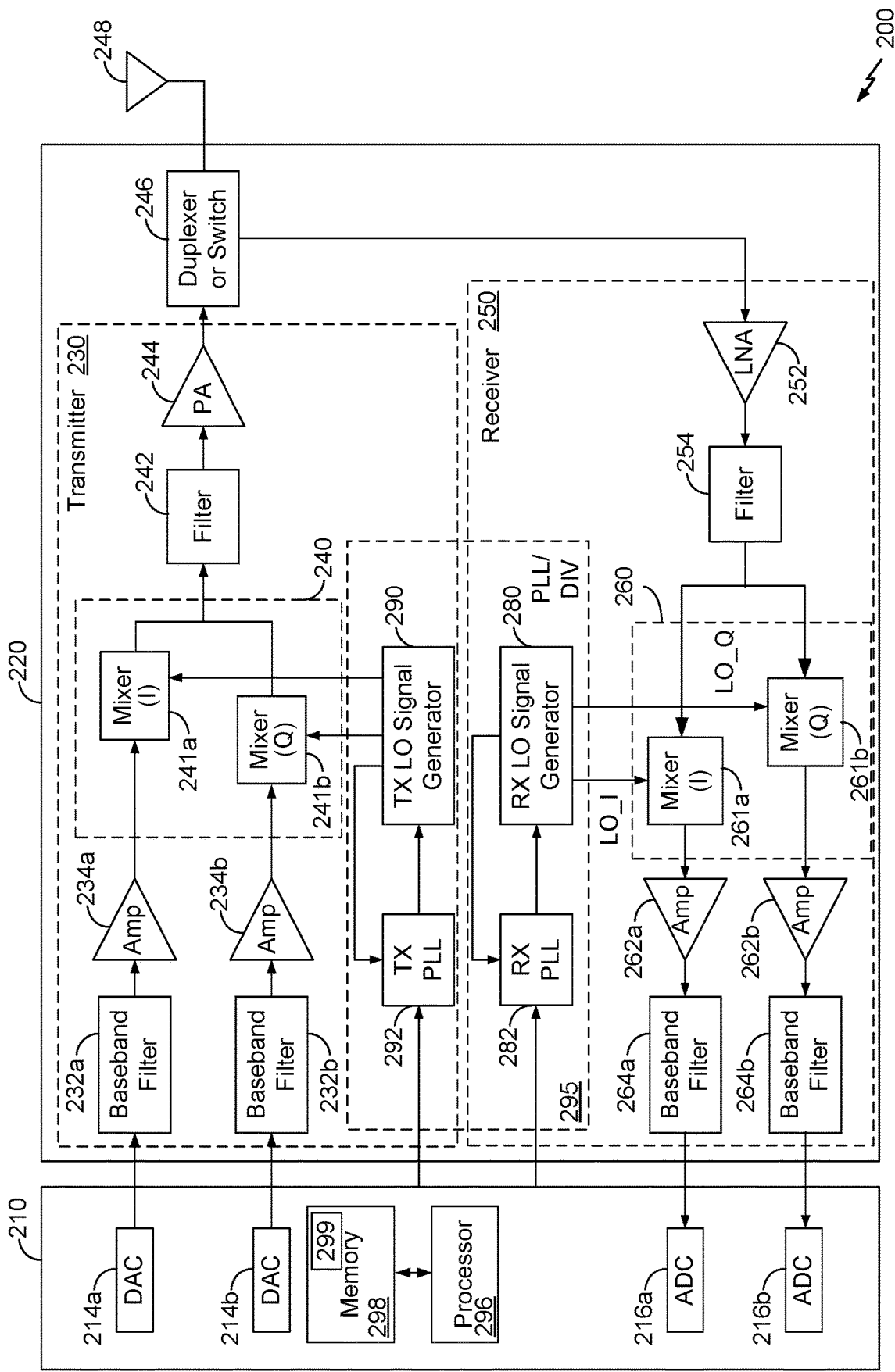
FIG. 2A is a block diagram showing a wireless device in which exemplary techniques of the present disclosure may be implemented.

FIG. 2A is a block diagram showing a wireless device 200 in which the exemplary techniques of the present disclosure may be implemented. The wireless device 200 may, for example, be an embodiment of the wireless device 110 and/or the wireless device 160 illustrated in FIG. 1.

FIG. 2A shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2A. Furthermore, other circuit blocks not shown in FIG. 2A may also be used to condition the signals in the transmitter 230 and receiver 250. Unless otherwise noted, any signal in FIG. 2A, or any other figure in the drawings, may be either single-ended or differential. Some circuit blocks in FIG. 2A may also be omitted.

In the example shown in FIG. 2A, wireless device 200 generally comprises the transceiver 220 and a data processor 210. The data processor 210 may include a processor 296 operatively coupled to a memory 298. The memory 298 may be configured to store data and program codes shown generally using reference numeral 299, and may generally comprise analog and/or digital processing components. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2A, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, baseband (e.g., lowpass) filters 232a and 232b filter the I and Q analog transmit signals, respectively, to remove undesired images caused by the prior digital-to-analog conversion. Amplifiers (Amp) 234a and 234b amplify the signals from baseband filters 232a and 232b, respectively, and provide I and Q baseband signals. An upconverter 240 having upconversion mixers 241a and 241b upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal is routed through a duplexer or switch 246 and transmitted via an antenna 248. While examples discussed herein utilize I and Q signals, those of skill in the art will understand that components of the transceiver may be configured to utilize polar modulation.

In the receive path, antenna 248 receives communication signals and provides a received RF signal, which is routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. Downconversion mixers 261a and 261b in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by baseband (e.g., lowpass) filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2A, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

In an exemplary embodiment, the RX PLL 282, the TX PLL 292, the RX LO signal generator 280, and the TX LO signal generator 290 may alternatively be combined into a single LO generator circuit 295, which may include common or shared LO signal generator circuitry to provide the TX LO signals and the RX LO signals. Alternatively, separate LO generator circuits may be used to generate the TX LO signals and the RX LO signals.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain components of the transceiver 220 are functionally illustrated in FIG. 2A, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules, chips, and/or components. For example, the power amplifier 244, the filter 242, and the duplexer 246 may be implemented in separate modules or as discrete components, while the remaining components illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, efficiency, or a combination of good linearity and efficiency.

In an exemplary embodiment in a super-heterodyne architecture, the filter 242, PA 244, LNA 252 and filter 254 may be implemented separately from other components in the transmitter 230 and receiver 250, and may be implemented on a millimeter wave integrated circuit. An example super-heterodyne architecture is illustrated in FIG. 2B.

Figure 2B:
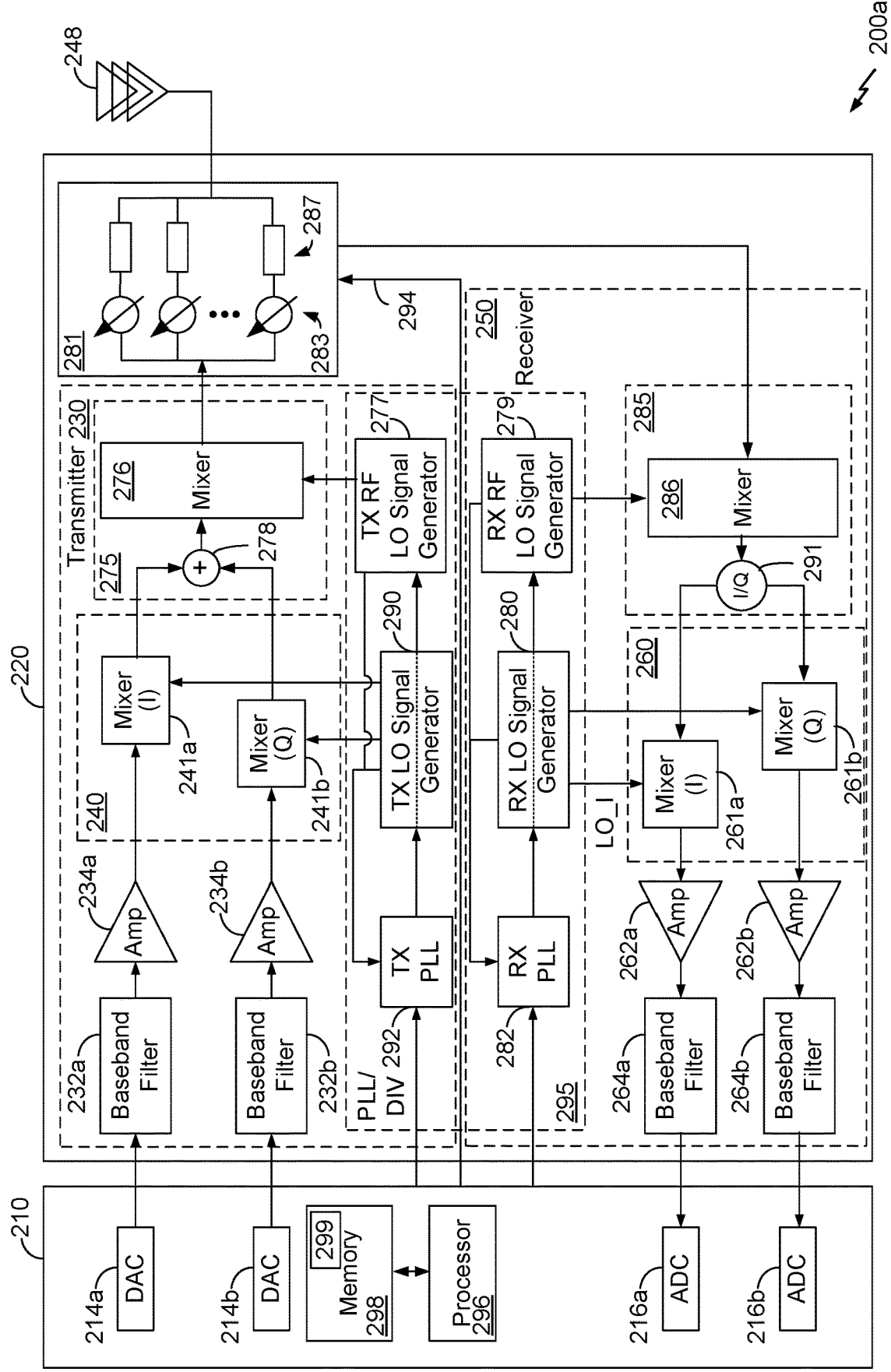
FIG. 2B is a block diagram showing a wireless device in which exemplary techniques of the present disclosure may be implemented.

FIG. 2B is a block diagram showing a wireless device in which the exemplary techniques of the present disclosure may be implemented. Certain components, for example which may be indicated by identical reference numerals, of the wireless device 200a in FIG. 2B may be configured similarly to those in the wireless device 200 shown in FIG. 2A and the description of identically numbered items in FIG. 2B will not be repeated.

The wireless device 200a is an example of a heterodyne (or superheterodyne) architecture in which the upconverter 240 and the downconverter 260 are configured to process a communication signal between baseband and an intermediate frequency (IF). For example, the upconverter 240 may be configured to provide an IF signal to an upconverter 275. In an exemplary embodiment, the upconverter 275 may comprise summing function 278 and upconversion mixer 276. The summing function 278 combines the I and the Q outputs of the upconverter 240 and provides a non-quadrature signal to the mixer 276. The non-quadrature signal may be single ended or differential. The mixer 276 is configured to receive the IF signal from the upconverter 240 and TX RF LO signals from a TX RF LO signal generator 277, and provide an upconverted RF signal to phase shift circuitry 281. While PLL 292 is illustrated in FIG. 2B as being shared by the signal generators 290, 277, a respective PLL for each signal generator may be implemented.

In an exemplary embodiment, components in the phase shift circuitry 281 may comprise one or more adjustable or variable phased array elements, and may receive one or more control signals from the data processor 210 over connection 294 and operate the adjustable or variable phased array elements based on the received control signals.

In an exemplary embodiment, the phase shift circuitry 281 comprises phase shifters 283 and phased array elements 287. Although three phase shifters 283 and three phased array elements 287 are shown for ease of illustration, the phase shift circuitry 281 may comprise more or fewer phase shifters 283 and phased array elements 287.

Each phase shifter 283 may be configured to receive the RF transmit signal from the upconverter 275, alter the phase by an amount, and provide the RF signal to a respective phased array element 287. Each phased array element 287 may comprise transmit and receive circuitry including one or more filters, amplifiers, driver amplifiers, and power amplifiers. In some embodiments, the phase shifters 283 may be incorporated within respective phased array elements 287.

The output of the phase shift circuitry 281 is provided to an antenna array 248. In an exemplary embodiment, the antenna array 248 comprises a number of antennas that typically correspond to the number of phase shifters 283 and phased array elements 287, for example such that each antenna element is coupled to a respective phased array element 287. In an exemplary embodiment, the phase shift circuitry 281 and the antenna array 248 may be referred to as a phased array. Although shown in FIG. 2B as having a particular architecture, the phase shift circuitry 281 may comprise other architectures depending on application.

In a receive direction, an output of the phase shift circuitry 281 is provided to a downconverter 285. In an exemplary embodiment, the downconverter 285 may comprise an I/Q generation function 291 and a downconversion mixer 286. In an exemplary embodiment, the mixer 286 downconverts the receive RF signal provided by the phase shift circuitry 281 to an IF signal according to RX RF LO signals provided by an RX RF LO signal generator 279. The I/Q generation function 291 receives the IF signal from the mixer 286 and generates I and Q signals for the downconverter 260, which downconverts the IF signals to baseband, as described above. While PLL 282 is illustrated in FIG. 2B as being shared by the signal generators 280, 279, a respective PLL for each signal generator may be implemented.

In some embodiments, the upconverter 275, downconverter 285, and the phase shift circuitry 281 are implemented on a common IC. In some embodiments, the summing function 278 and the I/Q generation function 291 are implemented separate from the mixers 276 and 286 such that the mixers 276, 286 and the phase shift circuitry 281 are implemented on the common IC, but the summing function 278 and I/Q generation function 291 are not (e.g., the summing function 278 and I/Q generation function 291 are implemented in another IC coupled to the IC having the mixers 276, 286). In some embodiments, the LO signal generators 277, 279 are included in the common IC. In some embodiments in which phase shift circuitry is implemented on a common IC with 276, 286, 277, 278, 279, and/or 291, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect. For example, components of the antenna array 248 may be implemented on a substrate and coupled to an integrated circuit implementing the phase shift circuitry 281 via a flexible printed circuit.

In some embodiments, both the architecture illustrated in FIG. 2A and the architecture illustrated in FIG. 2B are implemented in the same device. For example, a wireless device 110 or 200 may be configured to communicate with signals having a frequency below about 10 GHz using the architecture illustrated in FIG. 2A and to communicate with signals having a frequency above about 10 GHz using the architecture illustrated in FIG. 2B. In devices in which both architectures are implemented, one or more components of FIGS. 2A and 2B that are identically numbered may be shared between the two architectures. For example, both signals that have been downconverted directly to baseband from RF and signals that have been downconverted from RF to baseband via an IF stage may be filtered by the same baseband filter 264. In other embodiments, a first version of the filter 264 is included in the portion of the device which implements the architecture of FIG. 2A and a second version of the filter 264 is included in the portion of the device which implements the architecture of FIG. 2B.

Figure 3:
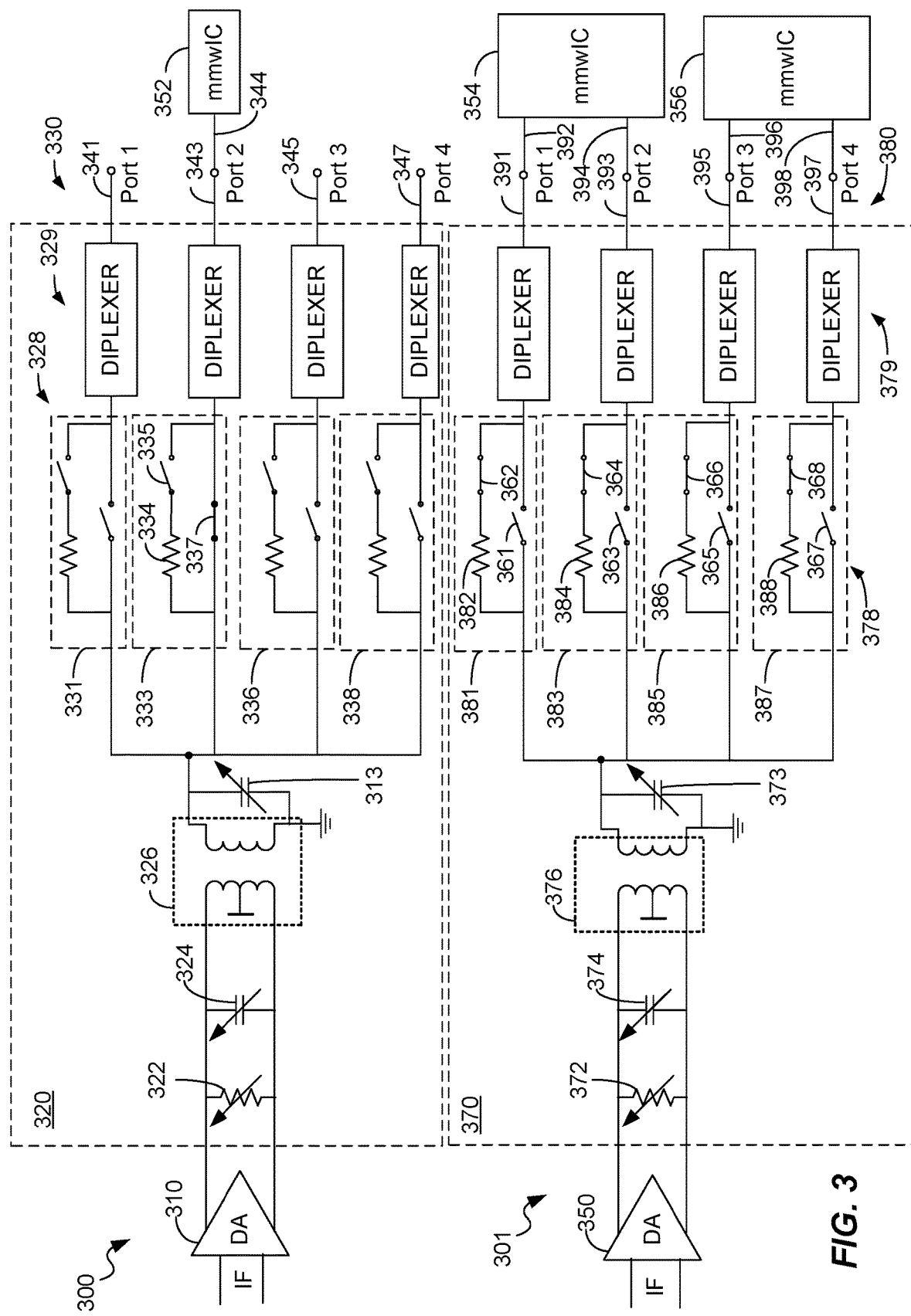
FIG. 3 shows two exemplary embodiments of a multi-mode, multi-port driver interface.

FIG. 3 shows two exemplary embodiments of a multi-mode, multi-port driver interface. A first exemplary embodiment of a multi-mode, multi-port driver interface 300 shows a driver amplifier (DA) 310, a load line impedance modulation circuit 320 and communication ports 330. The communication ports 330 may comprise communication port 1 341, communication port 2 343, communication port 3 345, and communication port 4 347. In an exemplary embodiment, the communication ports 330 may also be referred to as output ports. The load line impedance modulation circuit 320 comprises an adjustable resistance 322, an adjustable capacitance 324, a magnetic circuit 326, an adjustable capacitance 313, adjustable resistances 328, and diplexers 329. The adjustable resistances 328 may be implemented in a number of ways and in FIG. 3, are shown as comprising a resistor and two switches. For example, the adjustable resistance 333 may comprise a resistor 334 and switches 335 and 337. The adjustable resistances 331, 336 and 338 are similar to the adjustable resistance 333. The DA 310 may be configured to receive an intermediate frequency (IF) signal and provide an amplified IF signal to the communication ports 330. However, although IF signals are used in this example, the frequencies processed by the DA 310 and load line impedance modulation circuit 320 might be the actual transmission frequencies. Further, the communication ports 330 may comprise or be coupled to respective IC or chip inputs/outputs. A receive signal(s) may be provided to one or more of the communication ports 330 from a component external to the IC or chip, and the diplexer(s) 329 may route the receive signal to a receive chain (not illustrated). The adjustable resistance 322, the adjustable capacitance 324, the adjustable capacitance 313, and the adjustable resistances 328 may be controlled by a control signal from the data processor 210 or another control circuit.

A second exemplary embodiment of a multi-mode, multi-port driver interface 301 shows a driver amplifier (DA) 350, a load line impedance modulation circuit 370 and communication ports 380. The communication ports 380 may comprise communication port 1 391, communication port 2 393, communication port 3 395, and communication port 4 397. In an exemplary embodiment, the communication ports 380 may also be referred to as output ports. The load line impedance modulation circuit 370 comprises an adjustable resistance 372, an adjustable capacitance 374, a magnetic circuit 376, an adjustable capacitance 373, adjustable resistances 378, and diplexers 379. The adjustable resistances 378 may be implemented in a number of ways and in FIG. 3, are shown as comprising a resistor and two switches. For example, the adjustable resistance 381 may comprise a resistor 382 and switches 361 and 362; the adjustable resistance 383 may comprise a resistor 384 and switches 363 and 364; the adjustable resistance 385 may comprise a resistor 386 and switches 365 and 366; and the adjustable resistance 387 may comprise a resistor 388 and switches 367 and 368. The DA 350 may be configured to receive an IF signal and provide an amplified IF signal to the communication ports 380. However, although IF signals are used in this example, the frequencies processed by the DA 350 and load line impedance modulation circuit 370 might be the actual transmission frequencies. Further, the communication ports 380 may comprise or be coupled to respective IC or chip inputs/outputs. A receive signal(s) may be provided to one or more of the communication ports 380 (in this example, all of the communication ports 380) from a component external to the IC or chip, and the diplexer(s) 379 may route the receive signal to a receive chain (not illustrated). The adjustable resistance 372, the adjustable capacitance 374, the adjustable capacitance 373, and the adjustable resistances 378 may be controlled by a control signal from the data processor 210 or another control circuit.

In an exemplary embodiment, the multi-mode, multi-port driver interface 300 may be configured to support a single communication port, in this example, communication port 2 343, whereby the switch 337 is conductive and the switch 335 is non-conductive, thereby coupling the communication port 2 343 to the magnetic circuit 326. Further, the switches in the adjustable resistances 331, 336 and 338 are all non-conductive, such that communication port 1 341, communication port 3 345, and communication port 4 347 are not connected to the magnetic circuit 326 or to the DA 310. In the exemplary embodiment where the switch 337 is conductive, thereby coupling the communication port 2 343 to the magnetic circuit 326, the switch 335 is non-conductive, such that the resistor 334 does not contribute to excess loss. In this exemplary embodiment, the loss is minimized and the DA 310 provides higher gain and/or improved power efficiency. Although in this example a UE mode is used to support a single communication port, in other embodiments of a UE mode two or more outputs may be sent to two or more communication ports. In an exemplary embodiment, the multi-mode, multi-port driver interface 300 may be configured to support a user equipment (UE) in a low power mode (e.g., lower in power relative to a high power mode).

In an exemplary embodiment, the multi-mode, multi-port driver interface 301 may be configured to support multiple communication ports, such as, for example, two or four communication ports, such as to support a CPE in CPE mode or in CSM/FSM mode. In this example, all communication ports 380 are supported by the DA 350, whereby the adjustable resistances 378 all provide a relatively low resistance, thereby coupling all communication ports 380 to the magnetic circuit 376 through respective adjustable resistances 381, 383, 385 and 387. In this example, the switches 361, 363, 365 and 367 are all non-conductive and the switches 362, 364, 366 and 368 are all conductive, such that respective resistances 382, 384, 386 and 388 provide a relatively low resistance between the magnetic circuit 376 and the communication ports 380, where all of the communication ports 380 are enabled. In an exemplary embodiment, the respective resistances 382, 384, 386 and 388 may be configured to provide a relatively low resistance, on the order of 30 ohm to 40 ohm. In an exemplary embodiment, the multi-mode, multi-port driver interface 301 may be configured to support a customer premises equipment (CPE) in a high power mode (e.g., higher in power relative to the low power mode). In an exemplary embodiment, the multi-mode, multi-port driver interface 301 may be configured to support between one (1) and four (4) communication ports at the same frequency. In an exemplary embodiment, the multi-mode, multi-port driver interface 300 or 301 may be configured to support more or fewer communication ports, with four (4) communication ports being illustrated as an example only. In some embodiments, a single DA and a single magnetic circuit may support up to eight (8) or more communication ports.

In an exemplary embodiment, using a single DA (such as the DA 310 or the DA 350) to support multiple communication ports reduces circuit area, reduces local oscillator (LO) signal leakage, and helps to minimize or eliminate the DA-dependent RSB discrepancy among output ports mentioned above because a common DA is used to drive communication ports 1 through 4 instead of using a respective individual DA for each communication port.

Although in this example a CPE mode is used to support all four communication ports, in other embodiments fewer than all available communication ports may be used for a CPE mode.

The load line impedance modulation circuit 320 can be selectively configured to provide a higher load line impedance in UE (low power) mode, while the load line impedance modulation circuit 370 can be selectively configured to provide a lower load line impedance in CPE (high power) mode. As used herein, the term "load line" impedance refers to the impedance presented to the output of a driver amplifier, such as DA 310 and DA 350, and the term "load line impedance modulation" refers to adjusting the load line impedance based on a number of factors including the number of communication ports coupled to a single driver amplifier (DA). For example, selectively adjusting the load line impedance may be desirable to strike a balance between power consumption and linearity of the DA 310 and the DA 350.

In an example, the multi-port driver interface 300 or 301 may be coupled between the upconverter 240 and the upconverter 275. In another example, the multi-port driver interface 300 or 301 may be coupled between the summing function 278 and the upconversion mixer 276.

In an example, each communication port may be coupled to and may drive a separate mmwIC. For example, in a UE implementation, the communication port 2 343 may be coupled to a single mmwIC 352 over an interconnection 344. However, in a CPE implementation, the communication port 1 391 and the communication port 2 393 may be coupled to a mmwIC 354 over interconnections 392 and 394; and the communication port 3 395 and the communication port 4 397 may be coupled to a mmwIC 356 over interconnections 396 and 398. In another example, each of the communication ports 391, 393, 395, 397 are coupled to a respective mmwIC over a respective interconnection. The mmwICs 352, 354, 356 may include elements of the phase shift circuitry 281, upconverter, 275, and/or downconverter 285, and may be coupled to the antenna array 248. One or more of the mmwICs may be packaged together with the antenna array 248 in a module or the mmwIC may be implemented separate from the antenna array 248 and coupled thereto. In an example, the mmwIC 354 and the mmwIC 356 (and/or any other mmwICs coupled to the multi-port driver interface 301) may collectively implement some or all of a phased array system. In another example, one or more mmwICs coupled to the communication ports 391, 393, 395, 397 implement a phased array separate from the other mmwICs. Other numbers of mmwICs may be coupled to one or more communication ports than illustrated, with the configuration shown in FIG. 3 as an example only. In an exemplary embodiment, the mmwIC 352, mmwIC 354 and mmwIC 356 may be configured to convert an IF signal to a mmw signal. In an exemplary embodiment, the load line impedance modulation circuits 320 and 370 may be located on one IC and the mmwIC 352, mmwIC 354 and mmwIC 356 may be separate ICs coupled thereto by respective interconnects. In an exemplary embodiment, the interconnects 344, 392, 394, 396 and 398 may comprise circuit traces, coaxial cable, or other connections. In some UE configurations, there may be a single IC supporting a phased array/module. In a CPE, the ICs may be tiled, or layered, to support phased arrays having a larger number of elements. In an exemplary embodiment, a single DA and magnetic circuit, such as DA 350 and magnetic circuit 376, may be coupled to multiple communication ports to process a signal at a single frequency.

In some examples, one or more of the communication ports 341, 343, 345, 347, 391, 393, 395, 397 are coupled to an antenna without passing through a mmwIC. For example, one of the communication ports may be coupled to directly to an antenna or coupled to an antenna through a power amplifier module that does not include frequency conversion components. Such configuration may be advantageous when the output frequency of the multi-port driver interface 300 or 301 is the same as a frequency at which the antenna is configured to communicate.

Figure 4:
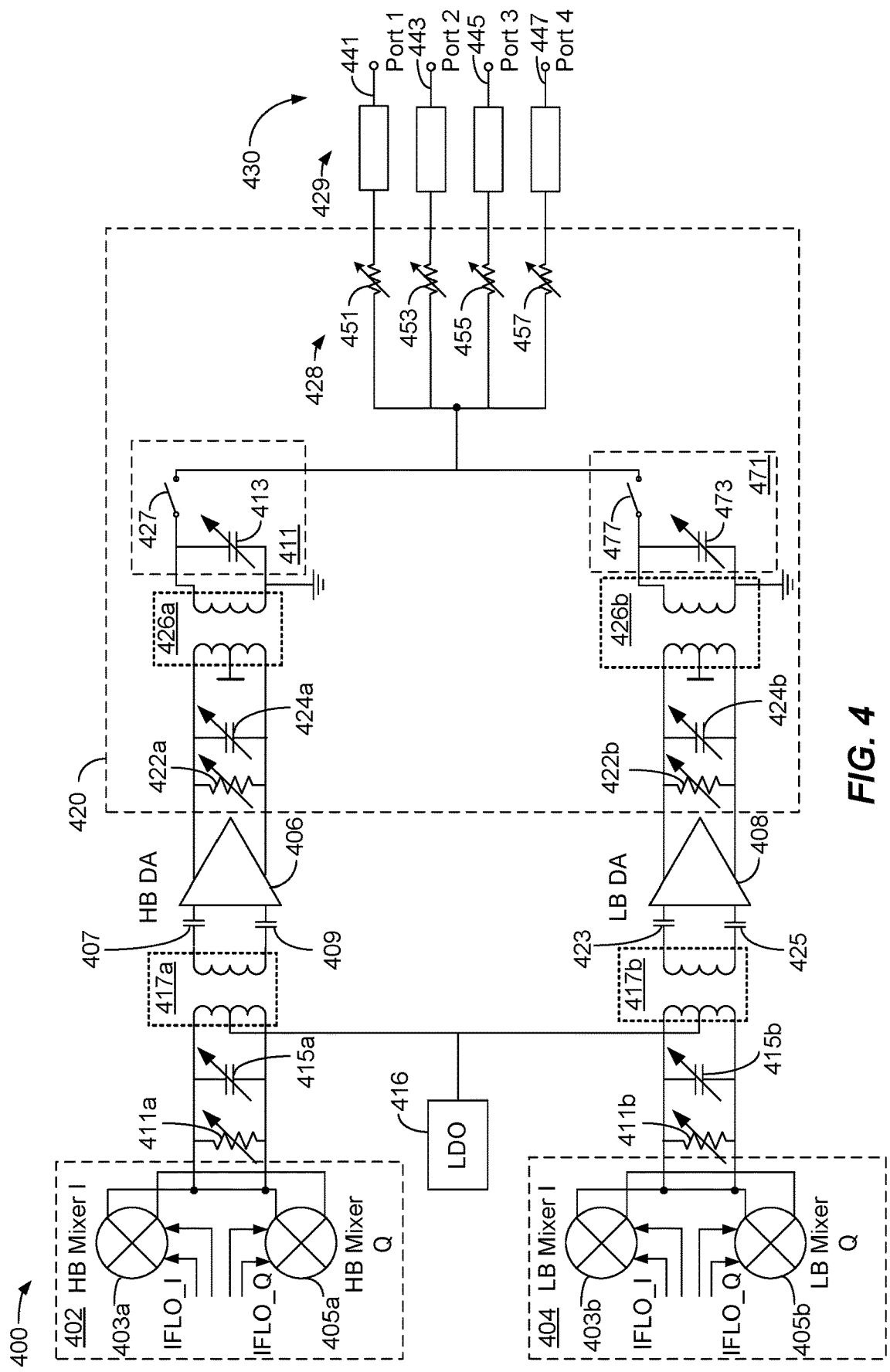
FIG. 4 shows an exemplary embodiment of a multi-mode, multi-port driver interface implemented in a portion of a multiple-band communication system.

FIG. 4 shows an exemplary embodiment of a multi-mode, multi-port driver interface implemented in a portion of a multiple-band communication system 400. In an exemplary embodiment, the communication system 400 includes a high band (HB) mixer 402 and a low band (LB) mixer 404. The high band mixer 402 comprises a high band in-phase (I) mixer 403a and a high band quadrature (Q) mixer 405a. The low band mixer 404 comprises a low band in-phase (I) mixer 403b and a low band quadrature (Q) mixer 405b. Each of the mixers 402 and 404 may be an example of the upconversion mixers 241a and 241b of FIG. 2B. Each of the mixers 402 and 404 may receive in-phase (I) and quadrature (Q) local oscillator (LO) signals from, for example, TX LO signal generator 290 of FIG. 2B, and may receive in-phase (I) and quadrature (Q) baseband signals from amplifiers 234a and 234b of FIG. 2B, and may provide in-phase (I) and quadrature (Q) communication signals at an intermediate frequency (IF). The IF signals may be provided to adjustable resistances 411a and 411b, adjustable capacitances 415a and 415b, and magnetic circuits 417a and 417b. The adjustable resistances 411a and 411b, and the adjustable capacitances 415a and 415b, may be controlled by a control signal from the data processor 210 or another control circuit. A low drop out voltage regulator (LDO) 416 may be coupled to the magnetic circuits 417a and 417b.

The communication system 400 includes an HB DA 406 configured to receive the I and Q outputs of the magnetic circuit 417a via capacitances 407 and 409; and an LB DA 408 configured to receive the output of the magnetic circuit 417b via capacitances 423 and 425. The HB DA 406 and the LB DA 408 are coupled to a load line impedance modulation circuit 420. In an exemplary embodiment, the load line impedance modulation circuit 420 may be similar to the load line impedance modulation circuits 320 and 370 of FIG. 3.

The load line impedance modulation circuit 420 may comprise adjustable resistances 422a and 422b, adjustable capacitances 424a and 424b, magnetic circuits 426a and 426b, a switch circuit 411 coupled to the output of the DA 406 via the magnetic circuit 426a, and a switch circuit 471 coupled to the output of the DA 408 via magnetic circuit 426b. In an exemplary embodiment, the switch circuit 411 may comprise a switch 427 and an adjustable capacitance 413. The switch 427 may be an output select switch and the adjustable capacitance 413 may be similar to the adjustable capacitance 313 of FIG. 3. In an exemplary embodiment, the switch circuit 471 may comprise a switch 477 and an adjustable capacitance 473. The switch 477 may be an output select switch and the adjustable capacitance 473 may be similar to the adjustable capacitance 373 of FIG. 3. The adjustable capacitance 413 and the adjustable capacitance 473 contribute to the selectable load line impedance modulation provided by the load line impedance modulation circuit 420.

The load line impedance modulation circuit 420 may also comprise adjustable resistances 428. Diplexers 429 and communication ports 430 may be coupled to the adjustable resistances 428. The adjustable resistances 428 may be similar to the adjustable resistances 328 and 378 of FIG. 3, the diplexers 429 may be similar to the diplexers 329 and 379 of FIG. 3, and the communication ports 430 may be similar to the communication ports 330 and 380 of FIG. 3. The communication ports 430 may comprise communication port 1 441, port 2 443, port 3 445, and port 4 447. The adjustable resistances 428 may comprise adjustable resistances 451, 453, 455 and 457. The adjustable resistances 451, 453, 455 and 457 may be adjusted by a control signal from the data processor 210 or another control circuit. The resistance provided by each adjustable resistance 451, 453, 455 and 457 may be selectively controlled to provide resistance between zero (0) ohms (a short circuit), and a resistance value that is dependent upon application. In an exemplary embodiment, each adjustable resistance 451, 453, 455 and 457 may be selectively controlled to provide a resistance that ranges between 20 ohms and 70 ohms. However, each adjustable resistance 451, 453, 455 and 457 may be selectively controlled to provide a resistance lower than 20 ohms and greater than 70 ohms.

The adjustable resistance 422a and 422b, the adjustable capacitance 424a and 424b, the adjustable capacitance 413, the adjustable capacitance 473, the switch 427, the switch 477 and the adjustable resistances 428 may be controlled by a control signal from the data processor 210 or another control circuit.

In an exemplary embodiment, the load line impedance modulation circuit 420 provides a selectable load line impedance, and the adjustable resistances 428 create a resistive splitter for output impedance matching.

As described previously, each of the communication ports may be individually and/or independently selected/enabled for use as an output. Switches may be used to implement this selectability. For example, switches may be integrated in the adjustable resistances 451, 453, 455, 457 as described with respect to FIG. 3. In other examples, the adjustable resistances 451, 453, 455, 457 may be configured to provide a high impedance (e.g., to act as an "open" circuit) using means other than a switch. In yet other examples, a switch may be included in series with each of the adjustable resistances 451, 453, 455, 457 (e.g., between the switches 427, 477, and a respective one of the adjustable resistances).

Figure 5:
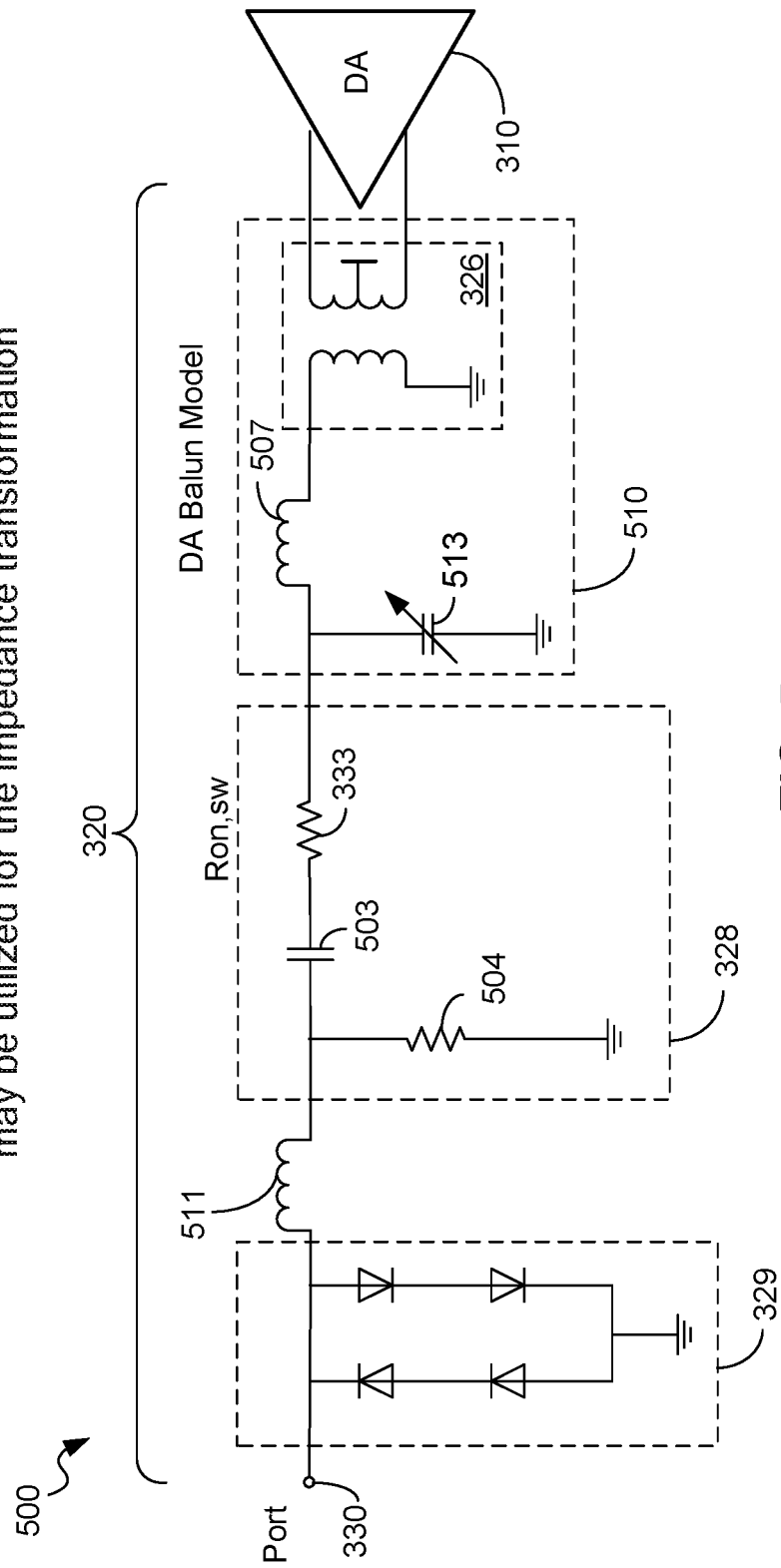
FIG. 5 shows an exemplary embodiment of the load line impedance modulation circuit of FIG. 3.

FIG. 5 shows an exemplary embodiment 500 of the load line impedance modulation circuit 320 of FIG. 3. The load line impedance modulation circuit 320 receives the output of the DA 310 and includes the magnetic circuit 326 located in a balun model circuit 510, the adjustable resistances 328, an inductance 511, the diplexer 329 and a communication port 330. The adjustable resistance 328 may also comprise a resistance 333, a capacitance 503 and a resistance 504. The exemplary embodiment of the load line impedance modulation circuit 320 may be implemented when the DA 310 is in a low power mode, for example, in UE mode, such as shown using the multi-mode, multi-port driver interface 300 of FIG. 3. In an exemplary embodiment, a relatively higher DA load line impedance (~80 ohm) may be provided by the load line impedance modulation circuit 320 in UE mode. The balun model circuit 510 includes an adjustable capacitance 513 and an inductive element 507, which can be used to provide the load line impedance modulation as described herein. The adjustable capacitance 513 may be an example of the adjustable capacitance 413 of FIG. 4. The resistance 333 illustrates the on-resistance of the adjustable resistance 333 when a single communication port 330 is coupled to the DA 310. For example, the resistance 333 will exhibit a relatively low on-resistance (on the order of 1-3 ohms) to minimize loss in a mode where one communication port, such as the communication port 2 343 of FIG. 3, is coupled to the DA 310. The adjustable resistances 328 provide output matching and power splitting functionality. The size of each resistance in the adjustable resistances 328 may be dependent on a number of factors, including, for example, a tradeoff between resistor size (resistance value) and insertion loss. For example, the size of each resistance in the adjustable resistances 328 may be chosen to meet an output impedance matching requirement by having the ability to provide a selectable resistance, such as, for example, a high resistance in a first mode and a low resistance in a second mode. There is a design tradeoff between the loss and output matching when choosing the size of the resistor and the resistance provided by the adjustable resistances 328.

Figure 6:
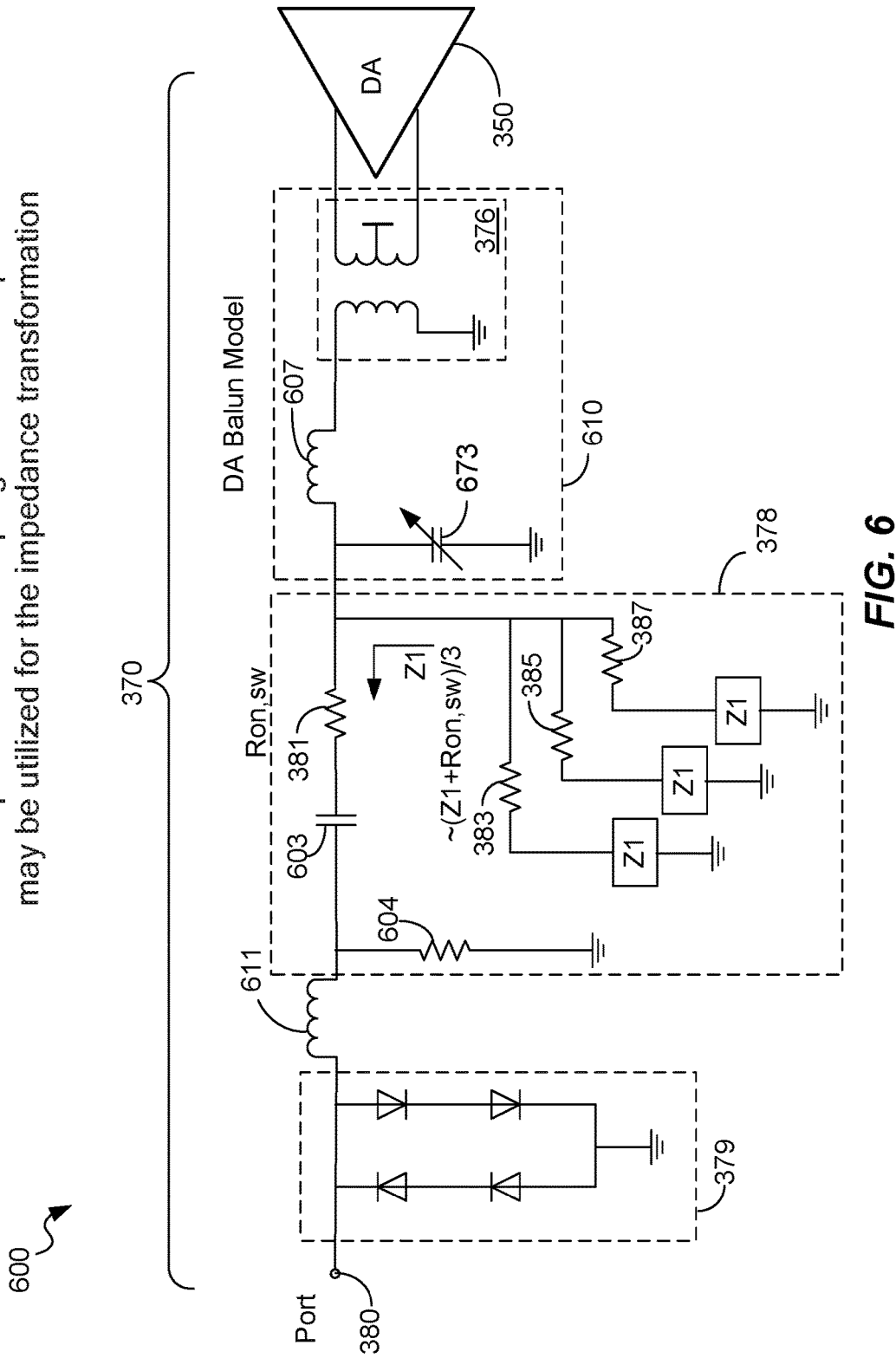
FIG. 6 shows an exemplary embodiment of the load line impedance modulation circuit of FIG. 3.

FIG. 6 shows an exemplary embodiment 600 of the load line impedance modulation circuit 370 of FIG. 3. The load line impedance modulation circuit 370 receives the output of the DA 350 and comprises the magnetic circuit 376 located in a balun model circuit 610, the adjustable resistances 378, an inductance 611, the diplexer 379 and a communication port 380. The exemplary embodiment of the load line impedance modulation circuit 370 may be implemented when the DA 350 is in a high power mode, for example, in CPE mode, where more than one communication port may be coupled to a DA. In an exemplary embodiment, a relatively lower DA load line impedance (~40 ohm) may be provided by the load line impedance modulation circuit 370 in CPE mode. The magnetic circuit 376 includes an adjustable capacitance 673 and an inductive element 607, which can be used to provide the load line impedance modulation described herein. The adjustable capacitance 373 may be an example of the adjustable capacitance 473 of FIG. 4. The adjustable resistance 378 illustrates the on-resistance of the adjustable resistances 378 when multiple communication ports 380 are coupled to the DA 350. For example, the resistances 381, 383, 385 and 387 will exhibit a relatively high on-resistance (on the order of 70 ohms) to maximize power in a mode where more than one communication port, such as the communication port 1 391, the communication port 2 393, the communication port 3 395 and the communication port 4 397 of FIG. 3, are coupled to the DA 350. In an exemplary embodiment, the adjustable resistances 378 may comprise resistors 382, 384, 386 and 388.

Figure 7:
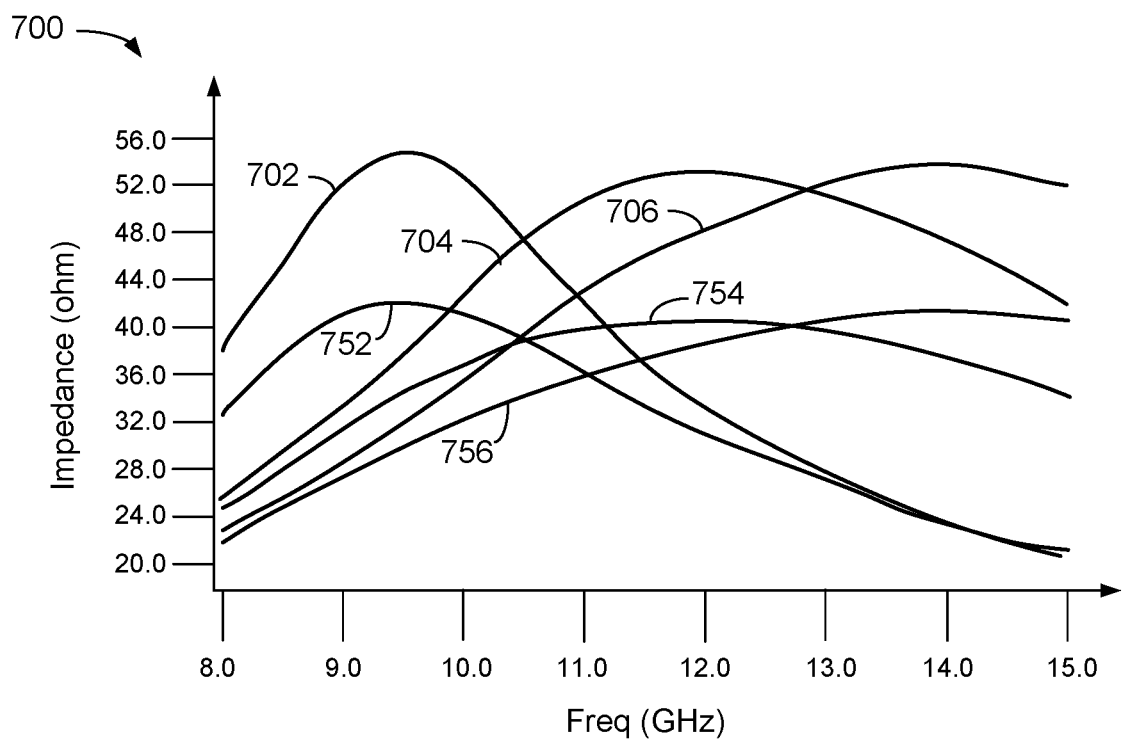
FIG. 7 is a diagram showing an effect of driver amplifier load line impedance modulation for UE modes and for CPE modes.

FIG. 7 is a diagram 700 showing an effect of driver amplifier load line impedance modulation for UE modes and for CPE modes. The vertical axis represents impedance (in ohms) and the horizontal axis represents frequency (in GHz). The traces 702, 704 and 706 show load line impedance over frequency in UE mode. The traces 752, 754 and 756 show load line impedance over frequency in CPE mode. In an exemplary embodiment, the adjustable components in the load line impedance modulation circuit 320, the load line impedance modulation circuit 370, or the load line impedance modulation circuit 420 may be adjusted to obtain a desired impedance at a desired frequency. In an exemplary embodiment, the desired load line impedance may be dependent upon the number of communication ports being coupled to a DA. In an exemplary embodiment, the desired load line impedance may be dependent upon the operating mode of a communication device.

In an exemplary embodiment, a lower DA load line impedance is desirable for implementations in which multiple communication ports are coupled to a single DA to improve DA linearity and satisfy the relatively higher power output (Pout).

In an exemplary embodiment, a higher DA load line impedance is desirable for implementations in which a single communication port is coupled to a single DA to improve efficiency at lower output power.

In an exemplary embodiment, a load line impedance modulation circuit allows a single DA to be optimized for linearity and efficiency.

In an exemplary embodiment, a load line impedance modulation circuit reduces the need for an increase in DA supply voltage for a higher power (CPE) mode.

Figure 8:
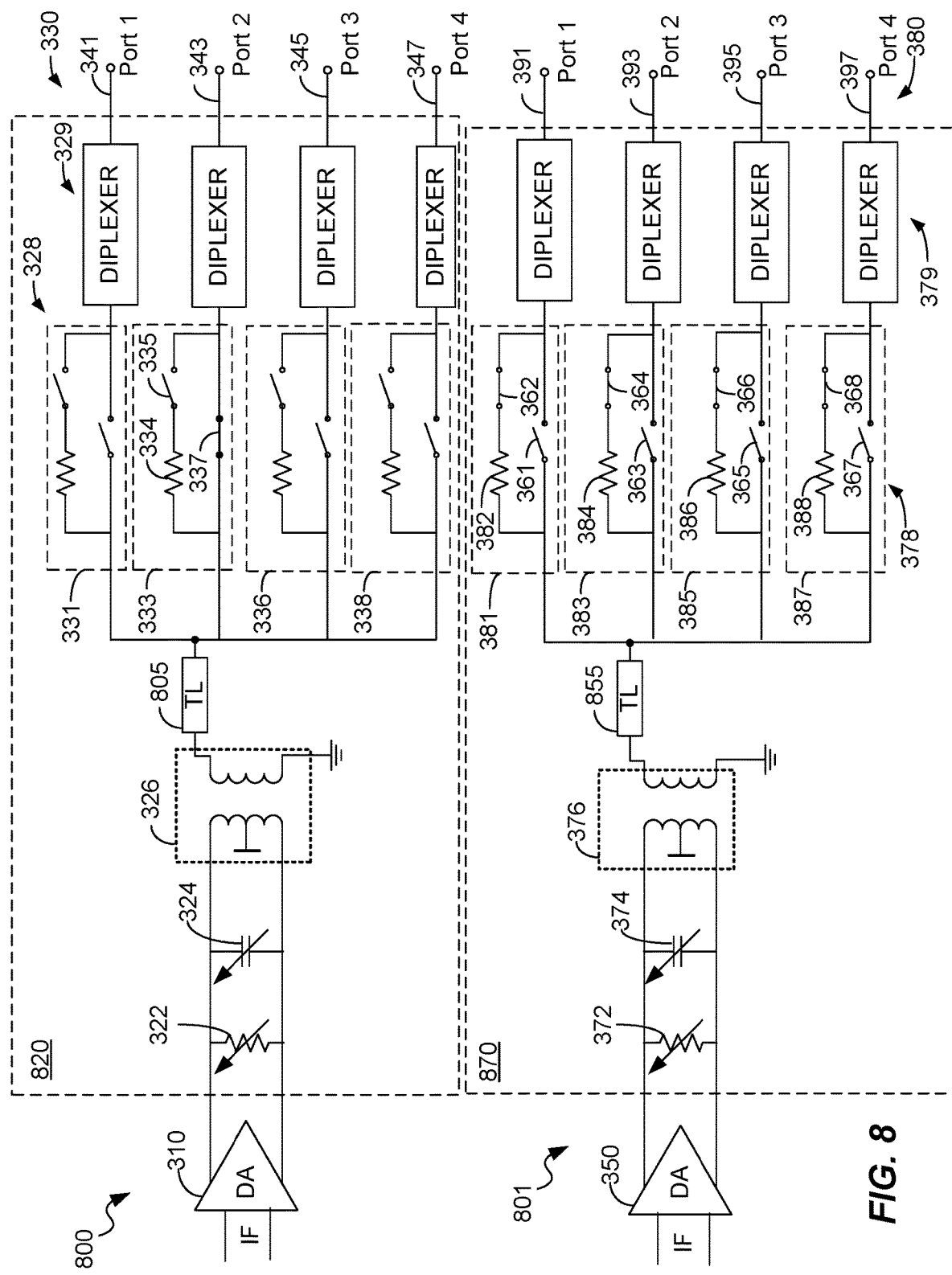
FIG. 8 shows two alternative exemplary embodiments of a multi-mode, multi-port driver interface.

FIG. 8 shows two alternative exemplary embodiments of a multi-mode, multi-port driver interface. A first exemplary embodiment of a multi-mode, multi-port driver interface 800 is similar to the multi-mode, multi-port driver interface 300 of FIG. 3, and identical elements are numbered according to the convention 8XX, where an element in FIG. 8 labeled 8XX is similar to an element in FIG. 3 labeled 3XX, and will not be described again. A second exemplary embodiment of a multi-mode, multi-port driver interface 801 is similar to the multi-mode, multi-port driver interface 301 of FIG. 3, and identical elements are identically numbered and will not be described again.

In an exemplary embodiment, the multi-mode, multi-port driver interface 800 includes a transmission line 805 located between the magnetic circuit 326 and the adjustable resistances 378. In an exemplary embodiment, an approximate 50 ohm impedance at the output of the magnetic circuit 326 corresponds to an approximate 50 ohm impedance at the input to the adjustable resistances 328 (adjustable resistance 333 in this example).

In an exemplary embodiment, the multi-mode, multi-port driver interface 801 includes a transmission line 855 located between the magnetic circuit 376 and the switches 377. In an exemplary embodiment, an approximate 50 ohm impedance at the output of the magnetic circuit 376 corresponds to an approximate (R+50)/4 ohm impedance at the input to the adjustable resistances 378 (all of the adjustable resistances 378 in this example).

FIG. 9 shows a table 900 illustrating RSB variation over four (4) ports in an exemplary high band (HB) CPE communication device in the 12.1 GHz band. The RSB variation for ports V1, V2, V3 and V4, shown by reference numeral 910 fall within 3.1 dBc of each other, while the RSB variation for ports H1, H2, H3 and H4, shown by reference numeral 920 fall within 1.4 dBc of each other. This illustrates a behavior that is not port dependent.

Figure 10:
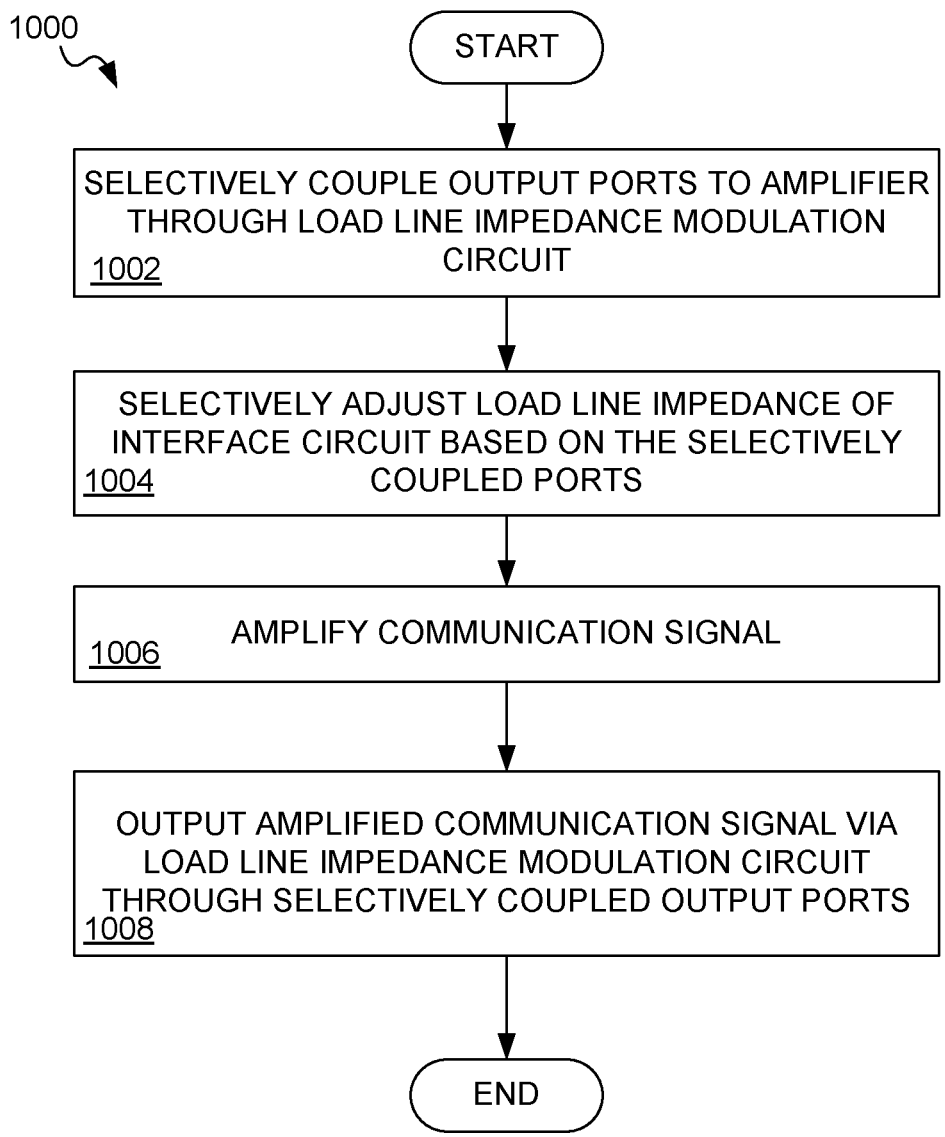
FIG. 10 is a flow chart describing an example of the operation of a method for signal processing.

FIG. 10 is a flow chart 1000 describing an example of the operation of a method for signal processing. The blocks in the method 1000 can be performed in or out of the order shown, and in some embodiments, can be performed at least in part in parallel.

In block 1002, output ports are selectively coupled to an amplifier through a load line impedance modulation circuit. For example, one or more communication ports 330 or 380 may be selectively coupled to a driver amplifier 310 or 350 through load line impedance modulation circuit 320 or 370. For example, a number (e.g., one through four in examples described above) of output ports may be selectively coupled to the amplifier.

In block 1004, the load line impedance of the interface circuit is selectively adjusted based on the selectively coupled ports. For example, the load line impedance of the multi-mode, multi-port driver interface 300 of FIG. 3 may be selectively adjusted depending on the number of selectively coupled communication ports 330 or 380.

In block 1006, a communication signal is amplified. For example, the driver amplifier 310 or 350 may amplify the communication signal.

In block 1008, the amplified communication signal may be output via the load line impedance modulation circuit through the selectively coupled output ports. For example, the amplified communication signal may be output via a load line impedance modulation circuit 320 or 370 through the selectively coupled output ports 330 or 380.

Figure 11:
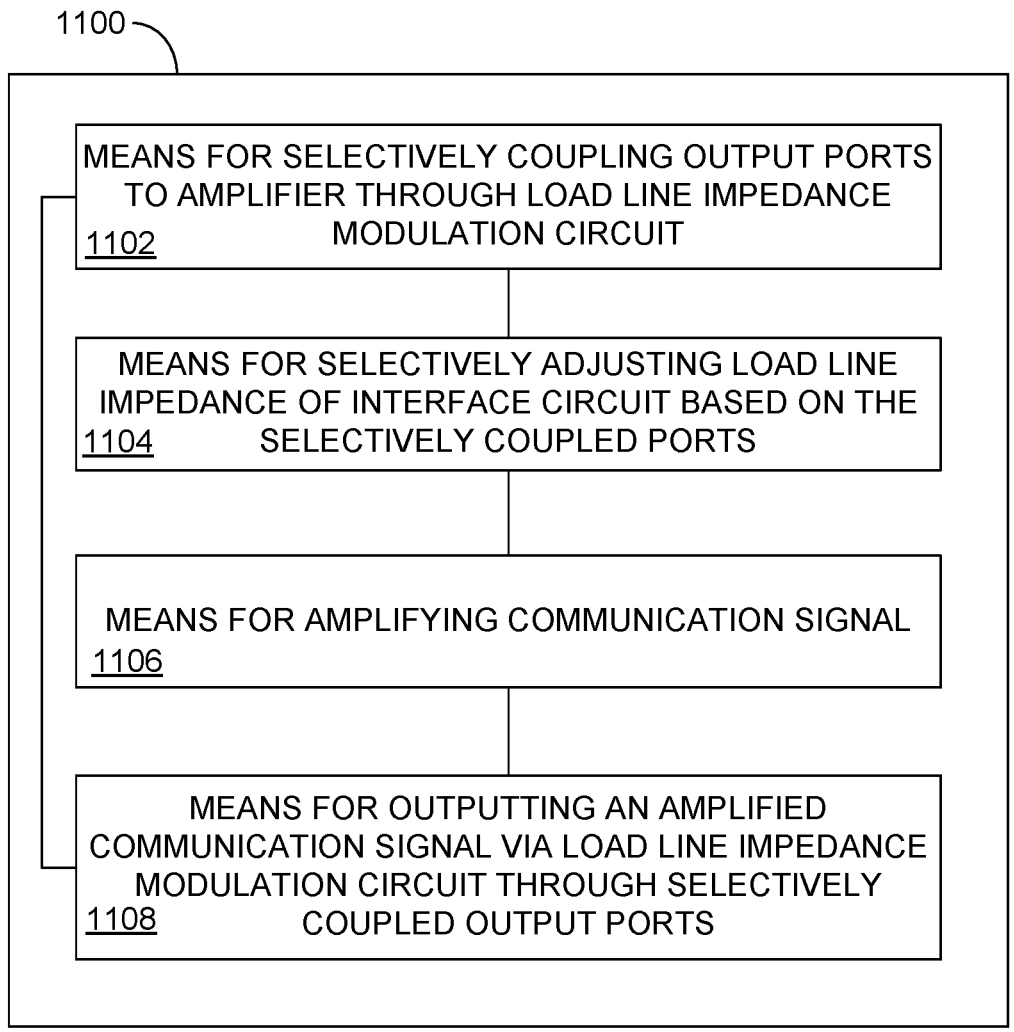
FIG. 11 is a functional block diagram of an apparatus for signal processing.

FIG. 11 is a functional block diagram of an apparatus for signal processing. The apparatus 1100 comprises means 1102 for selectively coupling (a number of) output ports to an amplifier through a load line impedance modulation circuit. In certain embodiments, the means 1102 for selectively coupling output ports to an amplifier through a load line impedance modulation circuit can be configured to perform one or more of the functions described in operation block 1002 of method 1000 (FIG. 10). In an exemplary embodiment, the means 1102 for selectively coupling output ports to an amplifier through a load line impedance modulation circuit may comprise one or more switches and/or adjustable resistances configured to selectively couple communication ports 330 or 380 to a driver amplifier 310 or 350 through load line impedance modulation circuit 320 or 370.

The apparatus 1100 may also comprise means 1104 for selectively adjusting the load line impedance of the interface circuit based on the (number of) selectively coupled ports. In certain embodiments, the means 1104 for selectively adjusting the load line impedance of the interface circuit based on the selectively coupled ports can be configured to perform one or more of the functions described in operation block 1004 of method 1000 (FIG. 10). In an exemplary embodiment, the means 1104 for selectively adjusting the load line impedance of the interface circuit based on the selectively coupled ports may comprise elements (e.g., a resistor, capacitor, switch, balun or transformer, etc.) of load line impedance modulation circuit 320 or 370, or a controller or process coupled thereto and configured to selectively adjusting the load line impedance of the multi-mode, multi-port driver interface 300 of FIG. 3 depending on a number of selectively coupled output ports.

The apparatus 1100 may also comprise means 1106 for amplifying a communication signal. In certain embodiments, the means 1106 for amplifying a communication signal can be configured to perform one or more of the functions described in operation block 1006 of method 1000 (FIG. 10). In an exemplary embodiment, the means 1106 for amplifying a communication signal may comprise the driver amplifier 310 or 350.

The apparatus 1100 may also comprise means 1108 for outputting an amplified communication signal via a load line impedance modulation circuit through the selectively coupled output ports. In certain embodiments, the means 1108 for outputting an amplified communication signal via a load line impedance modulation circuit through the selectively coupled output ports can be configured to perform one or more of the functions described in operation block 1008 of method 1000 (FIG. 10). In an exemplary embodiment, the means 1108 for outputting an amplified communication signal via a load line impedance modulation circuit through the selectively coupled output ports may comprise any elements of the multi-port driver interface 300 or 301 configured to convey the amplified communication signal through the load line impedance modulation circuit 320 or 370 and to the selectively coupled output ports 330 or 380.

Implementation examples are described in the following numbered clauses:

1. A transceiver interface circuit, comprising a driver amplifier (DA); a load line impedance modulation circuit coupled to the DA; and multiple selectable output ports coupled to the load line impedance modulation circuit, an impedance presented by the load line impedance modulation circuit being adjustable dependent on at least a number of output ports coupled to the load line impedance modulation circuit.

2. The transceiver interface circuit of clause 1, wherein an impedance presented by the load line impedance modulation circuit corresponds to a high impedance when the transceiver interface circuit is configured for one output port in a user equipment (UE) in a low power mode.

3. The transceiver interface circuit of any of clauses 1 or 2, wherein an impedance presented by the load line impedance modulation circuit corresponds to a low impedance when the transceiver interface circuit is configured for at least two output ports in a customer premises equipment (CPE) in a high power mode.

4. The transceiver interface circuit of any of clauses 1 through 3, wherein the load line impedance modulation circuit is implemented at an intermediate frequency (IF) in a multiple-band millimeter-wave (mmW) communication system.

5. The transceiver interface circuit of any of clauses 1 through 4, wherein the load line impedance modulation circuit comprises a resistive splitter configured to provide power splitting among the output ports.

6. The transceiver interface circuit of any of clauses 1 through 5, wherein the DA comprises a first DA configured for a first band, and wherein the interface circuit further comprises a second DA configured for a second band, the second DA coupled to the multiple selective output ports through at least a portion of the load line impedance modulation circuit.

7. The transceiver interface circuit of any of clauses 1 through 6, wherein the DA is configured to provide a transmit signal to the multiple selective output ports, and wherein the multiple selective output ports are configured to receive a receive signal from components external to the transceiver in which the transceiver interface circuit is disposed.

8. The transceiver interface circuit of any of clauses 1 through 7, wherein the transceiver interface circuit is coupled to a plurality of millimeter wave integrated circuits forming a phased array system.

9. The transceiver interface circuit of any of clauses 1 through 7, wherein the transceiver interface circuit is located on a first integrated circuit (IC) and is coupled to a second integrated circuit (IC) by an interconnect, the second IC configured to convert an intermediate frequency (IF) signal to a millimeter wave signal.

10. A method for communication, comprising selectively coupling a number of output ports to an amplifier through a load line impedance modulation circuit; selectively adjusting a load line impedance of the communication device based on the number of selectively coupled selected mode output ports; amplifying a communication signal; and outputting the amplified communication signal via the load line impedance modulation circuit through the selectively coupled output ports.

11. The method of clause 10, further comprising selectively coupling one output port to the amplifier in a user equipment (UE) mode.

12. The method of clause 10, further comprising selectively coupling two or four output ports to the amplifier in a customer premises equipment (CPE) mode.

13. The method clause 11, selectively adjusting the load line impedance to a relatively high impedance when one output port is selected in the UE mode in a low power mode.

14. The method of clause 12, further comprising selectively adjusting the load line impedance to a relatively low impedance when more than one output port is selected in the CPE mode in a high power mode.

15. The method of any of clauses 10 through 14, further comprising configuring the amplifier as a first driver amplifier (DA) for a first band; configuring a second amplifier as a second DA for a second band; and selectively coupling the second DA to the one or more output ports through at least a portion of the load line impedance modulation circuit.

16. The method of any of clauses 10 through 15, further comprising configuring the amplifier to provide a transmit signal to the one or more selectively coupled output ports, and wherein the one or more selectively coupled output ports are configured to receive a receive signal from components external to a transceiver of the communication device.

17. A device, comprising means for selectively coupling a number of output ports to an amplifier through a load line impedance modulation circuit; means for selectively adjusting a load line impedance based on the number of selectively coupled output ports; means for amplifying a communication signal; and means for outputting the amplified communication signal via the load line impedance modulation circuit through the selectively coupled output ports.

18. The device of clause 17, further comprising means for selectively coupling one output port to the amplifier in a user equipment (UE) mode.

19. The device of clause 17, further comprising means for selectively coupling two or four output ports to the amplifier in a customer premises equipment (CPE) mode.

20. The device of clause 18, further comprising means for selectively adjusting the load line impedance to a relatively high impedance when one output port is selected in the UE mode in a low power mode.

21. The device of clause 19, further comprising means for selectively adjusting the load line impedance to a relatively low impedance when more than one output port is selected in the CPE mode in a high power mode.

22. The device of any of clauses 17 through 21, wherein the amplifier is configured as an amplifier for a first band; wherein the device further comprises: means for amplifying signals for a second band; and means for selectively coupling the means for amplifying to the one or more output ports through at least a portion of the load line impedance modulation circuit.

23. The device of any of clauses 17 through 22, further comprising means for configuring the amplifier to provide a transmit signal to the one or more selectively coupled output ports, and wherein the one or more selectively coupled output ports are configured to receive a receive signal from components external to an integrated circuit including the means for amplifying.

24. A load line impedance modulation circuit, comprising a magnetic circuit; an adjustable capacitance coupled to an output of the magnetic circuit; and a plurality of adjustable resistances coupled to an output of the magnetic circuit, wherein the plurality of adjustable resistances are configured to select from available output ports, an impedance presented by the load line impedance modulation circuit being adjustable dependent on at least a number of selected output ports.

25. The load line impedance modulation circuit of clause 24, wherein an impedance presented by the load line impedance modulation circuit corresponds to a high impedance when configured for one selected output port in a user equipment (UE) in a low power mode.

26. The load line impedance modulation circuit of clause 24, wherein an impedance presented by the load line impedance modulation circuit corresponds to a low impedance when configured for more than one selected output port in a customer premises equipment (CPE) in a high power mode.

27. The load line impedance modulation circuit of any of clauses 24 through 26, wherein the load line impedance modulation circuit is implemented at an intermediate frequency (IF) in a multiple-band millimeter-wave (mmW) communication system.

28. The load line impedance modulation circuit of any of clauses 24 through 26, wherein the plurality of adjustable resistances comprises a resistive splitter configured to provide power splitting among the output ports.

29. The load line impedance modulation circuit of any of clauses 24 through 28, wherein the plurality of adjustable resistances are configured to select two output ports or four output ports.

30. The load line impedance modulation circuit of any of clauses 24 through 29, wherein each of the plurality of adjustable resistances comprises a first switch in parallel with a resistor and a second switch.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

What is claimed is:

1. A transceiver interface circuit, comprising:
a driver amplifier (DA);
a load line impedance modulation circuit coupled to the DA; and
multiple selectable output ports coupled to the load line impedance modulation circuit, an impedance presented by the load line impedance modulation circuit to the DA being adjustable dependent on at least a number of output ports coupled to the load line impedance modulation circuit.

2. The transceiver interface circuit of claim 1, wherein an impedance presented by the load line impedance modulation circuit corresponds to a high impedance when the transceiver interface circuit is configured for one output port in a user equipment (UE) in a low power mode.

3. The transceiver interface circuit of claim 1, wherein an impedance presented by the load line impedance modulation circuit corresponds to a low impedance when the transceiver interface circuit is configured for at least two output ports in a customer premises equipment (CPE) in a high power mode.

4. The transceiver interface circuit of claim 1, wherein the load line impedance modulation circuit is implemented at an intermediate frequency (IF) in a multiple-band millimeter-wave (mmW) communication system.

5. The transceiver interface circuit of claim 1, wherein the load line impedance modulation circuit comprises a resistive splitter configured to provide power splitting among the selectable output ports.

6. The transceiver interface circuit of claim 1, wherein the DA comprises a first DA configured for a first band, and wherein the transceiver interface circuit further comprises a second DA configured for a second band, the second DA coupled to the multiple selectable output ports through at least a portion of the load line impedance modulation circuit.

7. The transceiver interface circuit of claim 1, wherein the DA is configured to provide a transmit signal to the multiple selectable output ports, and wherein the multiple selectable output ports are configured to receive a receive signal from components external to a transceiver chip in which the transceiver interface circuit is disposed.

8. The transceiver interface circuit of claim 1, wherein the transceiver interface circuit is coupled to a plurality of millimeter wave integrated circuits forming a phased array system.

9. The transceiver interface circuit of claim 1, wherein the transceiver interface circuit is located on a first integrated circuit (IC) and is coupled to a second integrated circuit (IC) by an interconnect, the second IC configured to convert an intermediate frequency (IF) signal to a millimeter wave signal.

10. The transceiver interface circuit of claim 1, wherein at least one of the output ports is coupled between the DA and a power amplifier.

11. The transceiver interface circuit of claim 1, wherein no amplifier stage is coupled between the DA and any of the multiple selectable output ports.

12. The transceiver interface circuit of claim 1, wherein the multiple selectable output ports are coupled to a common node in the load line impedance modulation circuit.

13. The transceiver interface circuit of claim 1, wherein the DA is coupled to the multiple selectable output ports through at least a portion of the load line impedance modulation circuit.

14. The transceiver interface circuit of claim 13, wherein the DA comprises a first DA configured for a first band, and wherein the transceiver interface circuit further comprises a second DA configured for a second band, the second DA coupled to the multiple selectable output ports through at least a portion of the load line impedance modulation circuit.

15. A method for communication, comprising:
selectively coupling a number of output ports to an amplifier through a load line impedance modulation circuit;

selectively adjusting a load line impedance based on the number of selectively coupled output ports;
amplifying a communication signal; and
outputting the amplified communication signal via the load line impedance modulation circuit through the selectively coupled output ports.

16. The method of claim 15, further comprising:
selectively coupling one output port to the amplifier in a user equipment (UE) mode.

17. The method of claim 16, further comprising:
selectively adjusting the load line impedance to a relatively high impedance when one output port is selected in the UE mode in a low power mode.

18. The method of claim 15, further comprising:
selectively coupling two or four output ports to the amplifier in a customer premises equipment (CPE) mode.

19. The method of claim 18, further comprising:
selectively adjusting the load line impedance to a relatively low impedance when more than one output port is selected in the CPE mode in a high power mode.

20. The method of claim 15, further comprising:
configuring the amplifier as a first driver amplifier (DA) for a first band;
configuring a second amplifier as a second DA for a second band; and
selectively coupling the second DA to one or more output ports through at least a portion of the load line impedance modulation circuit.

21. The method of claim 15, further comprising configuring the amplifier to provide a transmit signal to the selectively coupled output ports, and wherein the selectively coupled output ports are configured to receive a receive signal from components external to an integrate circuit on which the amplifier is implemented.

22. A device, comprising:
means for selectively coupling a number of output ports to an amplifier through a load line impedance modulation circuit;
means for selectively adjusting a load line impedance based on the number of selectively coupled output ports;
means for amplifying a communication signal; and
means for outputting the amplified communication signal via the load line impedance modulation circuit through the selectively coupled output ports.

23. The device of claim 22, further comprising:
means for selectively coupling one output port to the amplifier in a user equipment (UE) mode.

24. The device of claim 23, further comprising:
means for selectively adjusting the load line impedance to a relatively high impedance when one output port is selected in the UE mode in a low power mode.

25. The device of claim 22, further comprising:
means for selectively coupling two or four output ports to the amplifier in a customer premises equipment (CPE) mode.

26. The device of claim 25, further comprising:
means for selectively adjusting the load line impedance to a relatively low impedance when more than one output port is selected in the CPE mode in a high power mode.

27. The device of claim 22, wherein the amplifier is configured as an amplifier for a first band; wherein the device further comprises:
means for amplifying signals for a second band; and
means for selectively coupling the means for amplifying to one or more output ports through at least a portion of the load line impedance modulation circuit.

28. The device of claim 22, further comprising:
means for configuring the amplifier to provide a transmit signal to the selectively coupled output ports, and wherein the selectively coupled output ports are configured to receive a receive signal from components external to an integrated circuit including the means for amplifying.

* * * * *